United States Patent
Ikeda et al.

(10) Patent No.: US 9,368,663 B2
(45) Date of Patent: *Jun. 14, 2016

(54) SOLAR CELL SEALING FILM AND SOLAR CELL USING THE SEALING FILM

(71) Applicant: BRIDGESTONE CORPORATION, Chuo-ku, Tokyo (JP)

(72) Inventors: Tetsuro Ikeda, Kanagawa (JP); Hisataka Kataoka, Kanagawa (JP); Yoshihiko Inoue, Kanagawa (JP)

(73) Assignee: BRIDGESTONE CORPORATION, Tokyo (JP)

( * ) Notice: Subject to any disclaimer, the term of this patent is extended or adjusted under 35 U.S.C. 154(b) by 18 days.

This patent is subject to a terminal disclaimer.

(21) Appl. No.: 14/303,828

(22) Filed: Jun. 13, 2014

(65) Prior Publication Data

US 2014/0296400 A1 Oct. 2, 2014

Related U.S. Application Data

(63) Continuation of application No. 13/129,040, filed as application No. PCT/JP2009/069166 on Nov. 11, 2009, now Pat. No. 8,791,182.

(30) Foreign Application Priority Data

Nov. 12, 2008 (JP) .................... 2008-289446
Mar. 13, 2009 (JP) .................... 2009-060788

(51) Int. Cl.
 *C08K 5/524* (2006.01)
 *C08L 23/08* (2006.01)
 (Continued)

(52) U.S. Cl.
 CPC ...... *H01L 31/0481* (2013.01); *B32B 17/10678* (2013.01); *B32B 17/10788* (2013.01); *C08K 5/524* (2013.01); *C08L 23/0853* (2013.01); *H01L 31/048* (2013.01);
 (Continued)

(58) Field of Classification Search
 None
 See application file for complete search history.

(56) References Cited

U.S. PATENT DOCUMENTS

| 4,117,195 A | 9/1978 | Swarbrick et al. |
| 4,574,133 A | 3/1986 | Umpleby |

(Continued)

FOREIGN PATENT DOCUMENTS

| CN | 101240157 A | 8/2008 |
| JP | 08-316508 A | 11/1996 |

(Continued)

*Primary Examiner* — Robert C Boyle
*Assistant Examiner* — Stephen Rieth
(74) *Attorney, Agent, or Firm* — Sugrue Mion, PLLC

(57) ABSTRACT

The object of the present invention is to provide a solar cell sealing film obtained from a composition comprising chiefly ethylene-vinyl acetate copolymer and organic peroxides for giving crosslinked structure, which suppresses the occurrence of blisters without reduction of crosslink rate, even if the film contains silane-coupling agents for improving adhesive strength. The solar cell sealing film comprises ethylene-vinyl acetate copolymer, an organic peroxide, a silane-coupling agent, and a phosphite compound represented by formula (I):

$$P(OR^1)_3 \qquad (I)$$

wherein, $R^1$ is a branched-chain aliphatic alkyl group having 8 to 14 carbon atoms, and three $R^1$s are the same as or different from each other and further wherein the content of the vinyl acetate recurring unit of the ethylene-vinyl acetate copolymer is in the range of 20 to 35% by weight.

8 Claims, 1 Drawing Sheet

(51) Int. Cl.
   *C08K 5/5419* (2006.01)
   *H01L 31/048* (2014.01)
   *B32B 17/10* (2006.01)
   *C08K 5/00* (2006.01)
   *C08K 5/14* (2006.01)

(52) U.S. Cl.
   CPC ................ *C08K 5/0025* (2013.01); *C08K 5/14* (2013.01); *C08K 5/5419* (2013.01); *Y02E 10/50* (2013.01)

(56) References Cited

U.S. PATENT DOCUMENTS

| | | | |
|---|---|---|---|
| 5,420,208 A | 5/1995 | Reid | |
| 5,660,645 A * | 8/1997 | Mori et al. | 136/251 |
| 8,791,182 B2 * | 7/2014 | Ikeda et al. | 524/147 |
| 9,112,081 B2 * | 8/2015 | Kataoka | |
| 2001/0045229 A1 | 11/2001 | Komori et al. | |

FOREIGN PATENT DOCUMENTS

| | | |
|---|---|---|
| JP | 09-092759 | 4/1997 |
| JP | 2000-183382 A | 6/2000 |
| JP | 2004-214641 | 7/2004 |
| JP | 2006-036874 | 2/2006 |
| JP | 2008-120952 A | 5/2008 |
| JP | 2008-311537 A | 12/2008 |

* cited by examiner

SOLAR CELL SEALING FILM AND SOLAR CELL USING THE SEALING FILM

CROSS REFERENCE TO RELATED APPLICATIONS

This application is a Continuation application of U.S. application Ser. No. 13/129,040, filed on May 12, 2011, which is a National Stage Application No. PCT/JP2009/069166 filed Nov. 11, 2009, claiming priorities based on Japanese Patent Application Nos. 2008-289446 filed Nov. 12, 2008 and 2009-060788 filed Mar. 13, 2009, the contents of all of which are incorporated herein by reference in their entirety.

TECHNICAL FIELD

The present invention relates to a solar cell sealing film comprising chiefly ethylene-vinyl acetate copolymer, particularly a solar cell sealing film, which comprises organic peroxides and silane-coupling agents, and has superior productivity. Furthermore, it relates to a solar cell using the sealing film.

BACKGROUND ART

In recent year, a solar cell (solar cell module) has been widely employed as a device directly converting solar energy into electric energy from the viewpoints of effective use of natural resources and ecology. Further development of solar cells is in progress.

As shown in FIG. 1, a solar cell generally includes a transparent front side protection material 11 (e.g., glass plate), a front side sealing film 13A, plural photovoltaic elements 14 (e.g., photovoltaic elements made of silicon), a backside sealing film 13B and a backside protection material 12 (backside covering member). For preparing a solar cell, first, the foregoing members are successively laminated in this order. Then, the laminated body is subjected to vacuum degassing, subsequently, heating under pressure for adhesively combining the laminated body by crosslinking or curing a front side sealing film 13A and a backside sealing film 13B. A conventional solar cell has connected plural photovoltaic elements 14 for generating a large electrical output. In order to ensure an electrical insulation property, plural photovoltaic elements 14 are sealed through a front side sealing film 13A and a backside sealing film 13B, which have high insulation properties.

Films made of ethylene-vinyl acetate (EVA) are used as sealing films in conventional solar cell because of low cost and high transparency. Furthermore, it is required that an EVA film used in sealing films is combined with members of a solar cell with keeping high adhesive strength, in order to ensure mechanical durability of the solar cell, and prevent internal electrical leads and electrodes from rust caused by humidity or permeated water.

For this reason, in the conventional solar cell sealing film, addition of organic peroxides as crosslinker to EVA gives crosslinked structure to improve weather resistance, and furthermore, addition of silane-coupling agents to EVA brings about the improvement of adhesive strength (Patent Document 1).

PRIOR ART DOCUMENTS

Patent Document

Patent Document 1: JP(TOKKAI) 2000-183382 A

SUMMARY OF THE INVENTION

Problem to be Solved by the Invention

However, addition of silane-coupling agents for improving adhesive strength causes reduction in crosslink rate, and reduction in productivity of the solar cell sealing film. On the other hand, increased additive amount of organic peroxides for increasing crosslink rate brings about blistering of film (hereinafter called "blister") by gas generation. Occurrence of blister reduces transparency of the sealing film, and reduces generating efficiency of the solar cells.

It is therefore an object of the present invention to provide a solar cell sealing film comprising chiefly ethylene-vinyl acetate copolymer, organic peroxides for giving crosslinked structure, which suppresses occurrence of blister without reduction of crosslink rate, even if the film contains silane-coupling agents for improving adhesive strength.

Furthermore, an object of the present invention is to provide a solar cell using the sealing film.

Means for Solving Problem

The above object is attained by a solar cell sealing film, comprising, ethylene-vinyl acetate copolymer, an organic peroxide, a silane-coupling agent, and a phosphite compound represented by formula (I):

[Formula 1]

$$P(OR^1)_3 \qquad (I)$$

wherein, $R^1$ is a branched-chain aliphatic alkyl group having 8 to 14 carbon atoms, and three $R^1$s are the same as or different from each other. The addition of a specific phosphite compound enables to suppress reduction of crosslink rate caused by silane-coupling agents. Furthermore, it is possible to prevent occurrence of blister by suppressing the additive amount of organic peroxides.

Preferred embodiments of the solar cell sealing film according to the present invention are described as follows:

(1) The phosphite compound is triisodecyl phosphite. The triisodecyl phosphite is not an environmental hormone material but a safe material, whereby a preferable solar cell sealing film can be obtained.

(2) The phosphite compound is contained in an amount of 0.01 to 5 parts by weight based on 100 parts by weight of the ethylene-vinyl acetate copolymer.

(3) The solar cell sealing film as defined in any of claims 1 to 3, wherein the phosphite compound and the silane-coupling agent comprising a silicon atom and an alkoxyl group are contained so that the atom ratio (Si/P) of the silicon atom (Si) combined with the alkoxyl group of the silane-coupling agent to a phosphorous atom (P) of the phosphite compound is 0.1 to 41.

(4) The solar cell sealing film as defined in any of claims 1 to 3, wherein the phosphite compound and the silane-coupling agent comprising a silicon atom and an alkoxyl group are contained so that the atom ratio (Si/P) of the silicon atom (Si) combined with the alkoxyl group of the silane-coupling agent to a phosphorous atom (P) of the phosphite compound is 0.1 to 36. By adjusting the content of the phosphite compound and the silane-coupling agent to have the above atom ratio, it is possible to more suppress reduction of crosslink rate to render the rate proper, whereby high adhesive strength can be ensured. Thus, a further preferable solar cell sealing film can be obtained.

(5) The silane-coupling agent is contained in an amount of 0.05 to 1 parts by weight based on 100 parts by weight of the ethylene-vinyl acetate copolymer.

(6) The phosphite compound is contained in an amount of 0.05 to 1 parts by weight based on 100 parts by weight of the ethylene-vinyl acetate copolymer.

(7) The sealing film is transparent. Such sealing film is suitable for use as a sealing film having excellent transparency, in which a reduction of transparency can become a problem, because the solar cell sealing film of the invention is suppressed in occurrence of blister and in reduction of transparency.

Furthermore, the above object is attained by a solar cell obtained by use of the solar cell sealing film of the present invention.

Advantageous Effects of the Invention

According to the present invention, in the solar cell sealing film comprising chiefly ethylene-vinyl acetate copolymer, organic peroxides for giving crosslinked structure, and silane-coupling agents for improving adhesive strength, it is possible to suppress occurrence of blister without reduction of crosslink rate. Thereby, the sealing film of the present invention having high productivity and suppression of transparency reduction can be ensured. Therefore, the use of the solar cell sealing film of present invention bring about a solar cell which is combined by high adhesive strength, and which prevents reduction of generating efficiency, and has high productivity.

DESCRIPTION OF EMBODIMENTS

Figure 1:
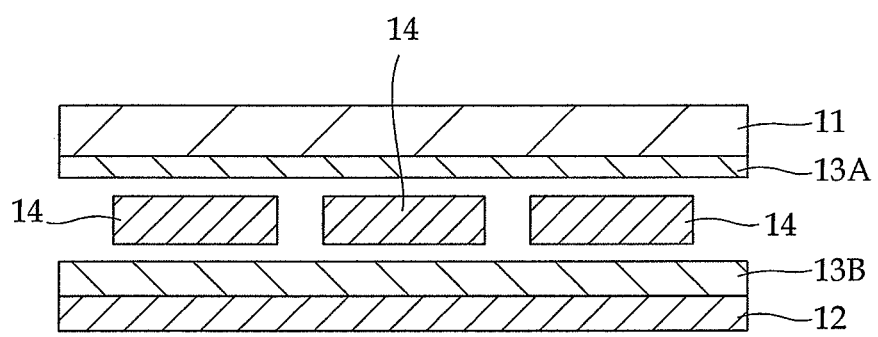
FIG. 1 is a schematic section view of a conventional solar cell.

A solar cell sealing film of the present invention comprises a specific phosphite compound as a crosslink promoter, in addition to an ethylene-vinyl acetate copolymer, an organic peroxide as a crosslinker, and a silane-coupling agent as an adhesion improver.

<Phosphite Compound>

The phosphite compound is capable of promoting the crosslink of ethylene-vinyl acetate copolymer by organic peroxide. The phosphite compound has a phosphorus atom and three hydrocarbon groups connected to the phosphorus atom via an oxygen atom. As the phosphite compound in the present invention, the compound represented by formula (I) is used:

[Formula 2]

$$P(OR^1)_3 \quad (I)$$

wherein, $R^1$ is a branched-chain aliphatic alkyl group having 8 to 14 carbon atoms, and three $R^1$s are the same as or different from each other.

As other phosphite compounds, secondary phosphite compounds represented by $(OH)P(OR^2)_2$, wherein $R^2$ is a hydrocarbon group having 1 to 20 carbon atoms, is also known. However, the secondary phosphite compound is easily hydrolyzed to form phosphonic acid, or the like. Namely, the secondary phosphite compound does not show the crosslink promoting effect as the tertiary phosphite compound of the invention represented by formula (I). Furthermore, the branched-chain trialkyl phosphite of formula (I) has high ultraviolet stability. Therefore, the phosphite compound is preferably used for a solar cell sealing film. In more detail, as discussed in the Examples below, the branched-chain trialkyl phosphite is more resistant to yellow discoloration by ultraviolet compared with a phosphite compound having aromatic hydrocarbon group, and hence the solar cell sealing film comprising the trialkyl phosphite, preferably maintains high transparency.

As the branched-chain group, an iso-octyl group, an iso-nonyl group, an iso-decyl group, an iso-dodecyl group, an iso-tridecyl group, an iso-tetradecyl group can be used.

Examples of the phosphite compound of formula (I) include trialkyl phosphite such as triisooctyl phosphite, triisononyl phosphite, triisodecyl phosphite, triisododecyl phosphite, or tris(isotridecyl)phosphite.

Of those trialkyl phosphite, it is preferable to use triisodecyl phosphite, triisododecyl phosphite, tris(isotridecyl)phosphite. Particularly, triisodecyl phosphite is preferably used, because it is effective as crosslink promoter, and does not correspond to an environmental hormone material to show high safety.

The content of the phosphite compound as described above in the sealing film of the invention is preferably in the range of 0.01 to 5 parts by weight, more preferably in the range of 0.05 to 1 part by weight, and particularly preferably in the range of 0.1 to 0.5 parts by weight, based on 100 parts by weight of ethylene-vinyl acetate copolymer. Accordingly, the crosslink promoting effect in the crosslink of ethylene-vinyl acetate copolymer by organic peroxide can be ensured.

<Silane-Coupling Agent>

The use of the silane-coupling agent enable to improve adhesive strength of ethylene-vinyl acetate copolymer. Examples of the Silane-coupling agents include γ-chloropropylmethoxysilane, vinylethoxysilane, vinyltris(β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane. These silane-coupling agents can be used singly, or in combination of two or more kinds. Furthermore, the content of the silane-coupling agent is preferably in the range of 0.01 to 5 parts by weight, particularly preferably in the range of 0.05 to 1 part by weight based on 100 parts by weight of ethylene-vinyl acetate copolymer.

Furthermore, in the solar cell sealing film of the invention, a content ratio of the phosphite compound to the silane-coupling agent comprising a silicon atom and an alkoxyl group is preferably a ratio that the atom ratio (Si/P) of silicone atom (Si) combined with alkoxyl group of the silane-coupling agent to a phosphorous atom (P) of the phosphite compound is 0.1 to 41. The atom ratio (Si/P) is more preferably 0.1 to 36, and particularly preferably 1 to 20. As discussed in the Examples below, by adjusting the content of the phosphite compound and the silane-coupling agent to have the above atom ratio (Si/P), it is possible to more suppress reduction of crosslink rate to render the rate proper, whereby high adhesive strength can be ensured. Thus, a further preferable solar cell sealing film can be obtained.

<Ethylene-Vinyl Acetate Copolymer>

The use of ethylene-vinyl acetate copolymer (occasionally abbreviated to EVA) as chief component brings about the sealing film having high transparency and high adhesive property. The content of vinyl acetate recurring unit is preferably in the range of 20 to 35% by weight, more preferably in the range of 20 to 30% by weight, particularly preferably in the range of 24 to 28% by weight, based on weight of ethylene-vinyl acetate copolymer. When the vinyl acetate content is less than 20% by weight, the sealing film crosslinked or cured at high temperature is apt not to show sufficiently high transparency. On the other hand, when the content is more than 35% by weight, bubbles possibly tend to generate at the interface between the sealing film and the protection material in the solar cell.

The solar cell sealing film of the invention may collaterally contain polyvinyl acetal resin (e.g., polyvinyl formal, polyvinyl butyral (PVB resin), modified PVB) or vinyl chloride resin, in addition to ethylene-vinyl acetate copolymer. PVB resin is preferable.

<Organic Peroxide>

The use of the organic peroxide as crosslinker enables the crosslink of ethylene-vinyl acetate copolymer. Therefore, it is possible to obtain a solar cell sealing film having improved adhesive strength, transparency, humidity resistance and penetration resistance.

Any organic peroxides that can be decomposed at a temperature of not less than 100° C. to generate radical(s) can be employed as the above-mentioned organic peroxide. The organic peroxide is generally selected in the consideration of film-forming temperature, conditions for preparing the composition, curing (bonding) temperature, heat resistance of body to be bonded, storage stability. In particular, it is preferable to use a material having a decomposition temperature of not less than 70° C. in a half-life of 10 hours.

From the viewpoint of resin processing temperature and storage stability, examples of the organic peroxides include 2,5-dimethylhexane-2,5-dihydroperoxide, 2,5-dimethyl-2,5-di(tert-butylperoxy)hexane, di-tert-butylperoxide, dicumyl peroxide, 2,5-dimethyl-2,5-di(2-ethylhaxanoylperoxy)hexane, 2,5-dimethyl-2,5-di(tert-butylperoxy)hexyne, tert-butylcumylperoxide, a,a'-bis(tert-butylperoxyisopropyl)benzene, a,a'-bis(tert-butylperoxy)diisopropylbenzene, 2,2-bis(tert-butylperoxy)butane, 1,1-bis(tert-butylperoxy)cyclohexane, 1,1-bis(tert-butylperoxy)-3,3,5-trimethylcyclohexane, tert-butylperoxybenzoate, benzoyl peroxide, 1,1-di(tert-hexylperoxy)-3,3,5-trimethylcyclohexane.

As the organic peroxide, it is particularly preferable to use 2,5-dimethyl-2,5-di(2-ethylhexanoylperoxy)hexane, and 1,1-di(tert-hexylperoxy)-3,3,5-trimethylcyclohexane.

The content of the organic peroxide in the sealing film is preferably in the range of 0.1 to 5 parts by weight, more preferably in the range of 0.2 to 1.8 parts by weight based on 100 parts by weight of ethylene-vinyl acetate copolymer.

<Crosslinking Auxiliary Agent>

The solar cell sealing film of the present invention may contain crosslinking auxiliary agent if necessary. The crosslinking auxiliary agent enables increase of gel fraction of ethylene-vinyl acetate copolymer and improvement of adhesive property and durability of the sealing film.

The crosslinking auxiliary agent is generally used in an amount of 10 parts by weight or less, preferably in the range of 0.1 to 5.0 parts by weight, based on 100 parts by weight of ethylene-vinyl acetate copolymer. Accordingly, it is possible to obtain a sealing film having an excellent adhesive property.

Examples of the cross-linking auxiliary agents (compounds having a radical polymerizable group as functional group) include tri-functional cross-linking auxiliary agents such as triallyl cyanurate and triallyl isocyanurate, mono- or di-functional crosslinking auxiliary agents of (meth)acryl esters (e.g., NK Ester, etc.). Among these compounds, triallyl cyanurate and triallyl isocyanurate are preferred, and triallyl isocyanurate is particularly preferred.

<Others>

The solar cell sealing film of the present invention may further contain various additives such as plasticizer, aryloxy group-containing compound, methacryloxy group for improvement or adjustment of various properties of the film (e.g., mechanical strength, adhesion property, optical characteristics such as transparency, heat-resistance, light-resistance, or crosslinking rate, etc.), in particular, for improvement of mechanical strength of the film if necessary.

Generally speaking, polybasic acid esters and polyhydric alcohol esters can be used as the above-mentioned plasticizer, although there are not particular restrictions to plasticizer to be used. Examples of the plasticizers include dioctyl phthalate, dihexyl adipate, triethylene glycol-di-2-ethylbutyrate, butyl sebacate, tetraethylene glycol diheptanoate and triethylene glycol dipelargonate. The plasticizers can be used singly, or in combination of two or more kinds. The content of the plasticizer preferably is not more than 5 parts by weight based on 100 parts by weight of ethylene-vinyl acetate copolymer.

Generally speaking, derivatives of acrylic acid or methacrylic acid, such as esters and amides of acrylic acid or methacrylic acid can be used as the above-mentioned acryloxy group-containing compound and methacryloxy group-containing compound. Examples of the ester residue include linear alkyl groups (e.g., methyl, ethyl, dodecyl, stearyl and lauryl), cyclohexyl group, tetrahydrofurfuryl group, aminoethyl group, 2-hydroxyethyl group, 3-hydroxypropyl group, 3-chloro-2-hydroxypropyl group. Example of the amide includes diacetone acryl amide. Further, the esters include esters of acrylic acid or methacrylic acid with polyhydric alcohol such as ethylene glycol, triethylene glycol, polypropylene glycol, polyethylene glycol, trimethylol propane or pentaerythritol.

Examples of the epoxy group containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-tert-butylphenyl glycidyl ether, diglycidyl adipate, diglycidyl phthalate, glycidyl methacrylate and butyl glycidyl ether.

The content of the acryloxy group-containing compound, methacryloxy group-containing compound or epoxy group containing compound is generally in the range of 0.5 to 5.0 parts by weight, particularly preferably 1.0 to 4.0 parts by weight based on 100 parts by weight of ethylene-vinyl acetate copolymer.

Further, the solar cell sealing film of the present invention may further contain ultraviolet absorbent, light stabilizer, and/or antioxidant.

By adding the ultraviolet absorbent to the sealing film, it is possible to prevent the ethylene-vinyl acetate copolymer from deteriorating due to light irradiation or the like, and the solar cell sealing film from yellowing. There is no particular restriction to ultraviolet absorbent to be used in the present invention. Preferable examples of the ultraviolet absorbent are benzophenone-type ultraviolet absorbents such as 2-hydroxy-4-methoxybenzophenone, 2-hydroxy-4-n-dodecyloxybenzophenone, 2,4-dihydroxybenzophenone, 2,2'-dihydroxy-4-methoxybenzophenone and 2-hydroxy-4-n-octoxybenzophenone. Moreover, the content of the benzophenone-type ultraviolet absorbent is preferably in the range of 0.01 to 5 parts by weight based on 100 parts by weight of ethylene-vinyl acetate copolymer.

It is also possible, by adding the light stabilizer to the sealing film, to prevent the ethylene-vinyl acetate copolymer from deteriorating due to light irradiation or the like, and the solar cell sealing film from yellowing. A hindered amine light stabilizer can be used as the light stabilizer. Examples of the light stabilizers include LA-52, LA-57, LA-62, LA-63, LA-63p, LA-67 and LA-68 (each manufactured by ADEKA Co., Ltd.), Tinuvin 744, Tinuvin 770, Tinuvin 765, Tinuvin 144, Tinuvin 622LD, and CHIMASSORB 944LD (each manufactured by Ciba Specialty Chemicals Co., Ltd.), and UV-3034 (each manufactured by B. F. Goodrich). The light stabilizers can be each used singly, or in combination of two or more kinds. The content of the light stabilizer is preferably in the range of 0.01 to 5 parts by weight based on 100 parts by weight of ethylene-vinyl acetate copolymer.

Examples of the antioxidants include hindered phenol-type antioxidants such as N,N'-hexan-1,6-diyl-bis[3-(3,5-di-tert-butyl-4-hydroxyphenyl) propionamide], phosphorus-type heat stabilizers, lactone-type heat stabilizers, vitamin E-type heat stabilizers and sulfur-type heat stabilizers.

The use of the solar cell sealing film of the invention enables to suppress occurrence of blister, and to prevent the reduction of transparency. Therefore, the sealing film of the invention is especially effective for use as a sealing film having transparency, in which a reduction of transparency can become a problem. Thus, the sealing film of the invention does not preferably contain fillers such as white inorganic pigments (e.g., titanium oxide), which reduce transparency of the sealing film.

The solar cell sealing film of the invention can be prepared in accordance with heretofore known processes. For example, the composition including the above-discussed materials is molded into a sheet-shaped article by extrusion molding or calendar molding (calendaring). Otherwise, the composition is dissolved in a solvent, the thus obtained solution is applied to an appropriate support by an appropriate coater, and then the applied solution is dried to form a coated film. Thus, a sheet-shaped article can be prepared. In case the film is formed by application of heat and pressure, e.g. by using extrusion molding, the heating temperature at the film-formation is generally in the range of 50 to 90° C. The solar cell sealing film of the invention does not have any particular restriction on the thickness, which is generally in the range of 50 μm to 2 mm.

The solar cell obtained by use of the sealing film of the invention does not have any particular restriction on the structure. Examples of the structure include a structure that photovoltaic elements between a transparent front side protection material and a backside protection material are sealed by adhesively combining with the interposed solar cell sealing films, a structure that a photovoltaic element formed on a surface of a backside protection material and a transparent front side protection material are sealed by adhesively combining with the interposed solar cell sealing film, and a structure that a photovoltaic element formed on a surface of a transparent front side protection material and a backside protection material are sealed by adhesively combining with the interposed solar cell sealing film. Examples of the solar cell using a photovoltaic element formed on a surface of a transparent front side protection material include thin-film solar cells obtained by forming a thin-film silicon type photovoltaic element, an amorphous silicon film type photovoltaic element, or a copper indium selenide (CIS) type photovoltaic element, etc. on surface of a transparent substrate such as a glass substrate, a polyimide substrate, and a fluorine resin type transparent substrate by sputtering method or chemical vapor deposition method.

For sufficiently sealing the photovoltaic elements in the solar cell, for instance, as shown in FIG. 1, a transparent front side protection material 11, a front side sealing film 13A, photovoltaic elements 14, a backside protection material 12 are laminated in this order. Thereafter, the sealing film is crosslinked or cured according to a conventional process such as the application of heating and pressure.

For performance of the application of heating and pressure, the laminated body can be introduced into a vacuum laminator and pressure bonded under heating in the conditions of temperature of 135 to 180° C. (preferably 140 to 180° C., especially 155 to 180° C.), degassing time period of 0.1 to 5 min., pressing pressure of 0.1 to 1.5 kg/cm$^2$ and pressing time period of 5 to 15 min. This heating enables the ethylene-vinyl acetate copolymer contained in the front side sealing film 13A and the backside sealing film 13B to crosslink, whereby the photovoltaic elements 14, the transparent front side protection material 11 and the backside protection material 12 are combined through the front side sealing film 13A and the backside sealing film 13B to seal the photovoltaic elements 14.

In the solar cell sealing film of the invention, it is possible to prevent transparency from decreasing, and to ensure the transparency. Thus, the sealing film of the invention is particularly preferably used as a front side sealing film located between photovoltaic elements and a transparent front side protection material.

In the invention, "front side" corresponds to a side of the photovoltaic element irradiated with the light (light-receiving side), whereas "backside" corresponds to the reverse side of the light-receiving side of the photovoltaic elements.

The transparent front side protection material 11 for use in the solar cell of the invention is generally a glass substrate such as silicate glass. The thickness of the glass substrate is generally in the range of 0.1 to 10 mm, preferably 0.3 to 5 mm. The glass substrate can be chemically or thermally tempered.

The backside protection material 12 for use in the invention is generally a plastic film such as polyethylene terephthalate (PET). From the viewpoint of heat resistance and moisture resistance, fluorinated polyethylene film (polyfluoroethylene film), especially a laminated film of fluorinated polyethylene film/Al/fluorinated polyethylene film in this order is preferable. It is preferable that the sealing film of the invention is used for a solar cell which has a plastic film such as a PET film as the backside protection material, since the plastic film such as PET has a low adhesive property with respect to a solar cell sealing film.

The solar cell (including thin-film solar cell) of the invention is characterized by the specific sealing films used as the front side and/or the backside sealing film. Namely, there is no particular restriction on the materials of the solar cell except for the sealing films (i.e., transparent front side protection material, backside protection material, photovoltaic elements, etc.). Those materials can have structures/compositions as those in heretofore known solar cells.

EXAMPLES

The invention is illustrated in detail using the following Examples.

Example 1

Materials with the formulation in Table 1 were supplied to a roll mill, and kneaded at 70° C. to prepare a composition for a solar cell sealing film. The composition for a sealing film was formed by calendaring at temperature of 70° C. After the formed composition was allowed to cool, a solar cell sealing film (thickness: 0.6 mm) was prepared.

Examples 2 to 7 and Comparative Examples 1 to 6

Compositions for solar cell sealing films were prepared in the same way as in Example 1, except that the materials and formulations are changed into those in Table 1. By using these compositions, solar cell sealing films were prepared.

[Evaluation Methods]

(1) Crosslink Rate

The solar cell sealing film prepared above was heated at 160° C. in an oven to be subjected to crosslinking reaction. An approximately 1 g of the sealing film was precisely collected as a sample at regular time intervals during reaction. The sample was subjected to an extraction treatment by heated xylene in Soxhlet extractor for 6 hours. Subsequently, the resultant gel component was dried at 80° C. for 12 hours or more, and precisely weighed. After that, a weight percent of the gel component based on a weight of the sample of the sealing film was calculated. A crosslink rate is defined as a crosslink time when the weight percent of the gel component reach 80%.

A crosslink rate of up to 10 minutes is set as the acceptable level.

(2) Adhesive Strength

Figure 2:
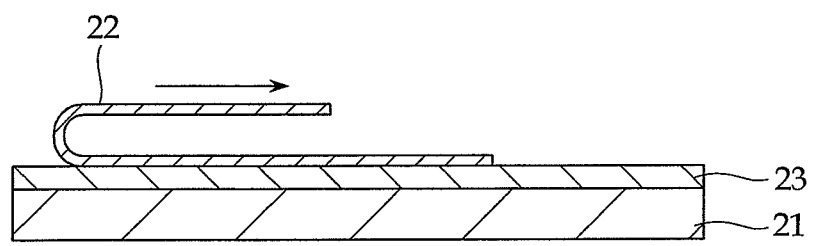
FIG. 2 is a schematic diagram for explaining 180° peel test.

The adhesive strengths of the sealing films were evaluated according to 180° peel test (JIS K 6584, 1994). 180° peel test was carried out in the following procedures as shown in FIG. 2.

A glass substrate 21, the solar cell sealing film 23 and PET film 22 (thickness: 50 μm, width: 10 cm) were laminated in this order. The obtained laminate was subjected to vacuum degassing by using a vacuum laminator and preliminary pressure contact treatment at a temperature of 100° C. Subsequently, the laminate was brought into an oven, and treated by application of pressure and heat at a temperature of 155° C., for 4 minutes. Thereafter, the laminate was left in an atmosphere of 23° C. and 50% RH for 24 hours. Then, the sealing film 23 was partially released from the PET film 22. The released part of the PET film 22 was folded by 180° turn. By using a tensile tester (Autograph, manufactured by Shimadzu Co., LTD), peal strength at a tensile speed of 100 mm/min was measured, as PET adhesive strength (N/cm). An adhesive strength of 10N/cm or more is set as the acceptable level.

(3) Blister Property (Blistering of Film by Gas Generation)

A glass substrate, the solar cell sealing film, a photovoltaic element, the solar cell sealing film and a gas barrier layer (Tedlar®) (polyethylene fluoride film (manufactured by DuPont)/aluminum foil/Tedlar®) were laminated in this order. The resultant laminate was subjected to vacuum disgassing by using a vacuum laminator. Subsequently, the laminate was heated at 160° C. in an oven. Then, a time until blistering of the film occurs by gas generation was measured as blister property. Blister property of 45 minutes or more is set as the acceptable level.

(4) Ultraviolet Stability

The solar cell sealing film was irradiated with ultraviolet light of 1000 W/m$^2$, for 150 hours by using EYE Super UV Tester (manufactured by IWASAKI ELECTRIC CO., LTD). A yellowness index (YI) of the sealing film was measured before and after the irradiation by using a colorimeter (Color Computer SM-5-IS-2B (manufactured by Suga Test Instruments Co., LTD). Then, a difference of yellowness index between before and after the irradiation was calculated as a change of the yellowness index (ΔYI).

[Evaluation Result]

The results are shown in Table 1. In Example 1 and Comparative Examples 1 to 3, the solar cell sealing films comprising the various phosphite compounds in the amount of 0.3 parts by weight based on 100 parts by weight of EVA are evaluated. The crosslink rates, the adhesive strengths and the blister properties of the sealing films are equivalent. However, as to the ultraviolet stabilities of the sealing films, the ΔYI of Example 1 using a branched-chain trialkyl phosphite shows lower value than that of Comparative Examples 1 to 3 using phosphite compounds having an aromatic hydrocarbon group. Namely, Example 1 is superior in ultraviolet stability to Comparative Examples 1 to 3. On the other hand, Comparative Example 4 comprising no phosphite compounds fails the blister property due to increase of the content of the organic peroxide for maintaining the crosslink rate. Furthermore, Comparative Example 5 comprising no phosphite compounds without increasing the content of the organic peroxide fails the crosslink rate. Moreover, Comparative Example 6 using a secondary phosphite compound fails crosslink rate, the same as Comparative Example 5. This is thought to be because the phosphite compound is hydrolyzed, and therefore the crosslink promoting effect is not sufficiently achieved.

Further, in Examples 2 to 7, the solar cell sealing films comprising the silane-coupling agent and triisodecyl phosphite as the phosphite compounds in different amounts are evaluated. As the result, in the case of the silane-coupling agent in the range of 0.05 to 1 parts by weight based on 100 parts by weight of EVA, and the phosphite compound in range of 0.05 to 1 parts by weight based on 100 parts by weight of EVA, the acceptable level of the crosslink rates, the adhesive strengths and the blister properties of the sealing films are excellent. Moreover, an index of the content ratio of the phosphite compound to the silane-coupling agent, the atom ratios (Si/P) of silicone atom (Si) combined with alkoxyl group of the silane-coupling agent to phosphorous atom (P) of the phosphite compound are shown in Table 1. In Example 7, which the atom ratio (Si/P) is 41, the crosslink rate is slightly small. Therefore, it is thought that the atom ratio (Si/P) affected a balance between the crosslink rate and the adhesive strength. Namely, by adjusting the content of the phosphite compound and the silane-coupling agent to have the atom ratio (Si/P) of 0.1 to 36, it is confirmed that a solar cell sealing film having higher crosslink rate and excellent adhesive strength can be obtained.

TABLE 1

|  |  | Ex. 1 | Comp. Ex. 1 | Comp. Ex. 2 | Comp. Ex. 3 | Ex. 2 | Ex. 3 | Ex. 4 |
|---|---|---|---|---|---|---|---|---|
| Formulation (part by weight) | EVA*1 | 100 | 100 | 100 | 100 | 100 | 100 | 100 |
| | Organic peroxside*2 | 1.3 | 1.3 | 1.3 | 1.3 | 1.8 | 1.8 | 1.8 |
| | Crosslinking auxiliary agent*3 | 1.5 | 1.5 | 1.5 | 1.5 | 1.5 | 1.5 | 1.5 |
| | Silane-coupling agent*4 | 0.2 | 0.2 | 0.2 | 0.2 | 0.05 | 0.5 | 0.9 |
| | Phosphite compound(1)*5 | 0.3 | 0 | 0 | 0 | 1 | 0.05 | 0.05 |
| | Phosphite compound(2)*6 | 0 | 0.3 | 0 | 0 | 0 | 0 | 0 |
| | Phosphite compound(3)*7 | 0 | 0 | 0.3 | 0 | 0 | 0 | 0 |
| | Phosphite compound(4)*8 | 0 | 0 | 0 | 0.3 | 0 | 0 | 0 |
| | Phosphite compound(5)*9 | 0 | 0 | 0 | 0 | 0 | 0 | 0 |

TABLE 1-continued

| | | | | | | | | |
|---|---|---|---|---|---|---|---|---|
| Content ratio | Silane-coupling agent/Phosphite compound | 0.67 | 0.67 | 0.67 | 0.67 | 0.05 | 10 | 18 |
| | Atom ratio (Si/P)*10 | 1.4 | 1.8 | 1.0 | 0.8 | 0.1 | 20 | 36 |
| Evaluation result | Crosslink rate (min.) | 7.2 | 7.5 | 7.4 | 7.5 | 5.5 | 7.8 | 8.9 |
| | Adhesive strength (N/cm) | 17.5 | 18.4 | 17.8 | 18.1 | 14.2 | 18.3 | 16.8 |
| | Blister property (min.) | 75 | 75 | 75 | 75 | 60 | 60 | 60 |
| | Change of the yellowness index (ΔYI) | 1.5 | 4.5 | 4.8 | 3.4 | 1.5 | 1.3 | 1.3 |

| | | Ex. 5 | Ex. 6 | Ex. 7 | Comp. Ex. 4 | Comp. Ex. 5 | Comp. Ex. 6 |
|---|---|---|---|---|---|---|---|
| Formulation (part by weight) | EVA*1 | 100 | 100 | 100 | 100 | 100 | 100 |
| | Organic peroxside*2 | 1.8 | 1.8 | 1.8 | 2.5 | 1.8 | 1.8 |
| | Crosslinking auxiliary agent*3 | 1.5 | 1.5 | 1.5 | 1.5 | 1.5 | 1.5 |
| | Silane-coupling agent*4 | 0.05 | 1 | 1 | 1 | 1 | 1 |
| | Phosphite compound(1)*5 | 0.05 | 1 | 0.05 | 0 | 0 | 0 |
| | Phosphite compound(2)*6 | 0 | 0 | 0 | 0 | 0 | 0 |
| | Phosphite compound(3)*7 | 0 | 0 | 0 | 0 | 0 | 0 |
| | Phosphite compound(4)*8 | 0 | 0 | 0 | 0 | 0 | 0 |
| | Phosphite compound(5)*9 | 0 | 0 | 0 | 0 | 0 | 1 |
| Content ratio | Silane-coupling agent/Phosphite compound | 1.0 | 1.0 | 20 | — | — | 1.0 |
| | Atom ratio (Si/P)*10 | 2.0 | 2.0 | 41 | — | — | — |
| Evaluation result | Crosslink rate (min.) | 6.4 | 7.5 | 9.9 | 7.7 | 10.9 | 10.7 |
| | Adhesive strength (N/cm) | 13.4 | 19.9 | 18 | 20.3 | 18.1 | 13.0 |
| | Blister property (min.) | 60 | 60 | 60 | 30 | 45 | 60 |
| | Change of the yellowness index (ΔYI) | 1.2 | 1.6 | 1.5 | 2.5 | 2.2 | 2.0 |

Note)
*1The content of vinyl acetate in EVA is 25% by weight.
*2 2,5-dimethyl-2,5-di(2-ethylhexanoylperoxy)hexane.
*3triarllyl isocyanurate.
*4γ-methacryloxypropyl trimethoxysilane (MW; 248.3).
*5triisodecyl phosphite (Adekastab3010 (ADEKA Corporation)) (MW; 503).
*6tris(nonylphenyl)phosphite (Adecastab1178 (ADEKA Corporation)) (MW; 689).
*7diphenylisodecyl phosphite (Adekastab135A (ADEKA Corporation)) (MW; 375).
*8triphenyl phosphite (AdecastabTTP (ADEKA Corporation)) (MW; 306).
*9di-2-ethylhexyl hydrogen phosphite (Sakai Chemical industry Corporation) (MW; 306).
*10Atom ratio of (Si) combined with alkoxyl group of silane-coupling agent to (P) of phosphite compound.

The invention is not restricted by the above mentioned Embodiments and Examples. Further, it is possible to make various changes within the scope of the invention.

DESCRIPTION OF THE REFERENCE NUMBERS

11: transparent front side protection material
12: backside protection material
13A: front side sealing film
13B: backside sealing film
14: photovoltaic element
21: glass substrate
22: PET film
23: solar cell sealing film

The invention claimed is:

1. A solar cell sealing film obtained from a composition consisting essentially of: ethylene-vinyl acetate copolymer, an organic peroxide selected from a group consisting of 2,5-dimethylhexane 2,5-dihydroperoxide, 2,5-dimethyl-2,5-di(tert-butylperoxy)hexane, di-tert-butylperoxide, dicumyl peroxide, 2,5-dimethyl-2,5-di(tert-butylperoxy)hexyne, tert-butylcumylperoxide, α,α'-bis(tert-butylperoxyisopropyl)benzene, α,α'-bis(tert-butylperoxy)diisopropylbenzene, 2,2-bis(tert-butylperoxy)butane, 1,1-bis(tert-butylperoxy)cyclohexane, 1,1-bis(tert-butylperoxy)-3,3,5-trimethylcyclohexane, tert-butylperoxybenzoate, benzoyl peroxide, and 1,1-di(tert-hexylperoxy)-3,3,5-trimethylcyclohexane, γ-methacryloxypropyl trimethoxysilane as a silane-coupling agent, and triisodecyl phosphite as a phosphite compound,
the organic peroxide being contained in an amount of 1.3 to 1.8 parts by weight based on 100 parts by weight of the ethylene-vinyl acetate copolymer,
the silane-coupling agent being contained in an amount of 0.05 to 1 part by weight based on 100 parts by weight of the ethylene-vinyl acetate copolymer, the phosphite compound being contained in an amount of 0.05 to 1 part by weight based on 100 parts by weight of the ethylene-vinyl acetate copolymer, and the content of vinyl acetate recurring unit of the ethylene-vinyl acetate copolymer being in the range of 20 to 35% by weight.

2. The solar cell sealing film as defined in claim 1, wherein 2,5-dimethyl-2,5-di(tert-butylperoxy)hexane is used as the organic peroxide.

3. The solar cell sealing film as defined in claim 1, wherein the phosphite compound and the silane-coupling agent are contained so that the atom ratio (Si/P) of the silicon atom (Si) combined with the alkoxyl group of the silane-coupling agent to a phosphorous atom (P) of the phosphite compound is 0.1 to 41.

4. The solar cell sealing film as defined in claim 2, wherein the phosphite compound and the silane-coupling agent are contained so that the atom ratio (Si/P) of the silicon atom (Si) combined with the alkoxyl group of the silane-coupling agent to a phosphorous atom (P) of the phosphite compound is 0.1 to 41.

5. The solar cell sealing film as defined in claim 1, wherein the phosphite compound and the silane-coupling agent are contained so that the atom ratio (Si/P) of the silicon atom (Si) combined with the alkoxyl group of the silane-coupling agent to a phosphorous atom (P) of the phosphite compound is 0.1 to 36.

6. The solar cell sealing film as defined in claim 2, wherein the phosphite compound and the silane-coupling agent are contained so that the atom ratio (Si/P) of the silicon atom (Si) combined with the alkoxyl group of the silane-coupling agent to a phosphorous atom (P) of the phosphite compound is 0.1 to 36.

7. A solar cell obtained by use of a solar cell sealing film as defined in claim 1.

8. A solar cell obtained by use of a solar cell sealing film as defined in claim 2.

\* \* \* \* \*